United States Patent [19]

Ho et al.

[11] 4,209,350

[45] Jun. 24, 1980

[54] METHOD FOR FORMING DIFFUSIONS HAVING NARROW DIMENSIONS UTILIZING REACTIVE ION ETCHING

[75] Inventors: Irving T. Ho; Jacob Riseman, both of Poughkeepsie, N.Y.

[73] Assignee: International Business Machines Corp., Armonk, N.Y.

[21] Appl. No.: 957,599

[22] Filed: Nov. 3, 1978

[51] Int. Cl.$^2$ ............... H01L 21/302; H01L 21/225; H01L 21/76

[52] U.S. Cl. .................................. 148/188; 29/578; 29/580; 148/1.5; 148/174; 148/175; 148/187; 156/643; 156/653; 156/657; 156/662; 204/192 E; 357/20; 357/48; 357/49; 357/50; 357/54; 357/56; 357/59

[58] Field of Search ............... 148/1.5, 174, 175, 187, 148/188; 204/192 E; 156/643, 644, 653, 657, 662; 427/93; 29/578, 580; 357/20, 48, 50, 49, 54, 56, 59

[56] References Cited

U.S. PATENT DOCUMENTS

| | | | |
|---|---|---|---|
| 3,398,029 | 8/1968 | Yasufuku et al. | 148/187 X |
| 3,730,787 | 5/1973 | Murphy et al. | 148/188 X |
| 3,966,577 | 6/1976 | Hochberg | 156/653 X |
| 4,026,740 | 5/1977 | Owen | 156/657 X |
| 4,037,307 | 7/1977 | Smith | 29/587 X |
| 4,103,415 | 8/1978 | Hayes | 29/578 X |
| 4,124,933 | 11/1978 | Nicholas | 148/187 X |
| 4,139,442 | 2/1979 | Bondur et al. | 204/192 E |
| 4,157,269 | 6/1979 | Ning et al. | 148/1.5 |
| 4,160,991 | 7/1979 | Anantha et al. | 357/49 |

OTHER PUBLICATIONS

Critchlow, D. L., "High Speed Mosfet . . . Using Advanced Lithography" Computer, vol. 9, No. 2, Feb. 1976, pp. 31–37.

Pogge, H. B., ", Narrow Line With Masking Method" I.B.M. Tech. Discl. Bull., Nov. 1976, vol. 19, No. 6, 1976.

Abbas et al., "Extending Minimal Dimensions . . . Fabrication Processing" Ibid., vol. 20, No. 4, Sep. 1977, pp. 1376–1378.

Bersin, R. L., "Survey of Plasma Etching Processes" Solid-State Tech., May 1976, pp. 31–36.

Jambotkar, C. G., "Method for Reducing Emitter-Base Contact . . . "I.B.M. Tech. Discl. Bull., vol. 19, No. 12, May 1977, pp. 4601–4604.

Primary Examiner—R. Dean
Assistant Examiner—W. G. Saba
Attorney, Agent, or Firm—George O. Saile

[57] ABSTRACT

A method for forming diffusions having narrow, for example, submicrometer dimensions in a silicon body which involves forming insulator regions on a silicon body, which insulator regions have substantially horizontal surfaces and substantially vertical surfaces. A layer having a desired dopant concentration is formed thereon, both on the substantially horizontal surfaces and the substantially vertical surfaces. Reactive ion etching of the layer acts to substantially remove only the horizontal layer and provides a narrow dimensioned layer having a desired dopant concentration in the substantially vertical surfaces. Heating of the body at a suitable temperature is accomplished so as to produce the movement of the dopant into the silicon body by diffusion to form diffusions having narrow, such as submicrometer dimensions, therein.

18 Claims, 19 Drawing Figures

METHOD FOR FORMING DIFFUSIONS HAVING NARROW DIMENSIONS UTILIZING REACTIVE ION ETCHING

DESCRIPTION

Technical Field

This invention relates to methods for forming highly dense and very small, integrated circuit semiconductor devices, and more particularly, to methods for forming diffusions having narrow dimensions into a silicon body.

Cross References To Related Patent Applications (1) Patent application Ser. No. 957,606 filed like date entitled "Method For Forming An Insulator Between Layers of Conductive Material" by J. Riseman (FI9-78-021).

(2) Patent application Ser. No. 957,604 filed like date entitled "Method For Forming A Narrow Dimensioned Region On A Body" by H. B. Pogge (FI9-78-022).

(3) Patent application Ser. No. 957,605 filed like date entitled "Method For Forming A Narrow Dimensioned Mask" by I. T. Ho and J. Riseman (FI9-78-023).

BACKGROUND ART

There has been a dramatic increase in the complexity of silicon integrated circuits over the past ten years. As applications develop for microprocesses and minicomputers there is an increasing demand for greater complexities, higher switching speeds, and smaller devices in the integrated circuit. The major technology in the semiconductor process which allows this increase complexity of integrated circuits is the lithographic technology. Over the past few years only modest reductions in line widths were achieved. It has been the photolithographic defect level reductions which have allowed the high levels of integration to be achieved. There has been a gradual decrease in line widths from about 5 to 10 micrometers to about 3 to 5 micrometers at the present time. Light has been used almost exclusively until the present time in the lithographic process. However, optical resolution limits make further advances much more difficult. The thrust today is to non-light lithography, and in particular to electron beam and X-ray exposure processes to achieve the higher packing densities required for the future. These problems and their possible solutions are discussed in greater detail by B. L. Critchlow in the publication entitled, "High Speed MOSFET Circuits Using Advanced Lithography", published in the Computer, Volume 9, No. 2, February 1976, pages 31 through 37. In that publication the substantial equipment cost and complexities of X-ray and electron beam lithography are described. However, up until now it has been believed that these were the only alternatives to optical projection printing for high complexity integrated circuit devices of the future.

There have been other efforts to obtain narrow line widths in the range of 1 micrometer or less by extending standard photolithography techniques and avoiding the need to use the more expensive and complex techniques such as electron beam or X-ray lithography. One such technique is described by H. B. Pogge in IBM Technical Disclosure Bulletin, November 1976, Volume No. 6, entitled "Narrow Line Widths Masking Method." This method involves the use of a porous silicon followed by oxidation of the porous silicon. Another technique is described by S. A. Abbas, et al, IBM Technical Disclosure Bulletin, Volume 20, No. 4, September 1977, pages 1376 through 1378. This TDB describes the use of polycrystalline silicon masking layers which are made into masks by first using an intermediate mask of oxidation blocking material, such as silicon nitride in the formation of the polycrystalline silicon. Line dimensions below about 2 micrometers may be obtained by this technique.

Plasma or reactive ion etching is a technique which has been developed for etching metals, semiconductor materials and dielectrics in the manufacture of integrated circuit devices. In particular, the method of reactive ion etching which is capable of doing anisotropic etching wherein very high aspect ratios can be obtained, that is the ratio of vertical etching is much greater than the horizontal etching. The process involves the use of a plasma or ionized gas containing a variety of highly reactive particles such as ions, free electrons and free radicals. The plasmas used in etching may be maintained at relatively low temperatures of the order up to 250° C. and low pressures in the range of 0.005 to 20 torr. The particles in the plasma are largely free radicals which cause the plasma's intense reactivity. The ion population in low temperature plasma is of the order of one percent of the particles. "A Survey of Plasma-Etching Processes" by Richard L. Bersin published in Solid State Technology, May 1976, pages 31 through 36 in great detail describe the plasma etching process and its application to semiconductor materials. The process has been used to make trenches or openings in silicon semiconductor bodies of various patterns as shown by Arthur K. Hochberg, U.S. Pat. No. 3,966,577 issued June 29, 1976; J. A. Bondur patent application Ser. No. 824,361 filed Aug. 15, 1977, now U.S. Pat. No. 4,604,086, and assigned to the assignee of the present patent application and J. A. Bondur, et al, patent application Ser. No. 832,856 filed Sept. 13, 1977, now U.S. Pat. No. 4,139,442, and assigned to the assignee of the present patent application. Further information about the process for reactive ion or plasma etching may be more fully understood by reference to the J. N. Harvilchuck, et al, patent application Ser. No. 594,413 filed July 9, 1975, now abandoned and continuation patent application Ser. No. 822,775 filed Aug. 8, 1977 now abandoned, and continuation patent application Ser. No. 960,322 filed Nov. 13, 1978. The RF induced plasma in the Harvilchuck, et al patent application is reactive chlorine, bromine or iodine specie. A precise description of the RF discharge apparatus and the processing is given in detail in that patent application.

Doped polycrystalline silicon have been used in place of metals such as aluminum, aluminum-copper and so forth for the ohmic contact to silicon regions. U.S. Pat. Nos. 3,664,896 to D. M. Duncan, 3,978,515 to W. J. Evans et al, and N. Anantha, et al patent application Ser. No. 844,769 filed Oct. 25, 1977, now U.S. Pat. No. 4,160,991, describe the use of polycrystalline silicon as contacts to regions in monocrystalline semiconductor devices. Published Japanese Patent Applications 50-1986, Appln No. 45-51721 (51721/70), filed June 15, 1970, inventor S. Yamazaki, and JA Patent Publication 51-36989, Application No. 45-113252 (113252/70) filed Dec. 17, 1970, inventor S. Yamazaki show, respectively, a metal insulator silicon field effect transistor device wherein the source, drain and gate electrodes are made of a conductive coating essentially consisting of the same material as the semiconductor substrate and a low doped semiconductor layer in a bipolar semiconductor transistor which acts as a conductive layer. "A 100 PS bipolar logic" by T. Sakai et al, published ISSCC '77 Feb. 18, 1977, Session XVI: High Speed Logic, pp 196 and 197 describes an elevated polycrystalline silicon electrode to be used as part of the circuit interconnection in a similar way to that of a silicon gate MOS integrated circuit. "Method for Reducing the Emitter-Base Contact Distance in Bipolar Transistors", C. G. Jambotkar, IBM TDB Vol. 19, No. 12, May 1977, pages 4601 to 4604, describes a high speed bipolar integrated circuit which uses P+ doped polysilicon for linking the base to base metallization and N+ polysilicon to link the emitter and collector reach-through metallization. It is also known to use highly doped polycrystalline silicon as the source of dopant for regions of monocrystalline silicon. The polycrystalline silicon then can either be removed or allowed to become part of the device as the contact for the region formed by the out-diffusion. These processes are taught, for example, by D. M. Duncan U.S. Pat. Nos. 3,978,515; E. Sussman 3,502,517; and in "Polycrystalline Silicon as a Diffusion Source and Interconnect Layer in I²L Realizations" by Jan Middelhoek, et al, published in IEEE Journal of Solid-State Circuits, Vol. SC-12, No. 2, April 1977, pp. 135-138.

It is the object of the invention to extend the use of conventional lithography techniques to line widths in the submicrometer range by utilizing the plasma or reactive ion etching process to form submicrometer diffusion sources which may be used in the fabrication of highly dense integrated circuits.

SUMMARY OF THE PRESENT INVENTION

In accordance with the present invention, a method for forming diffusions having narrowed dimensions in a silicon body is described wherein insulator regions having substantially horizontal surfaces and substantially vertical surfaces are formed on a silicon body. A layer having a desired dopant concentration therein is formed on both the substantially horizontal surfaces and the substantially vertical surfaces. Reactive ion or plasma etching is utilized to substantially remove the layer from the horizontal surfaces and to provide a narrow dimensioned layer on the substantially vertical surfaces. Diffusion is accomplished by heating the body at a suitable temperature to cause the dopant from the layer to diffuse into the silicon body to form the diffusions of a narrow dimension in the order of fractions of a micrometer.

High density double diffused field effect integrated circuit devices can be made according to the present technique by again providing a silicon body having insulator regions thereon with substantially horizontal surfaces and substantially vertical surfaces. A layer having the desired dopant concentration therein is then formed on both the substantially horizontal surfaces and the substantially vertical surfaces. The reactive ion etching step is utilized to remove the layer from the horizontal surfaces and to leave the layer on the substantially vertical surfaces while forming openings to the silicon body itself. Source and drain diffusions are made through the openings by either thermal diffusion or ion implantation into the silicon body. These source and drain regions are made through the openings which are adjacent to the narrow dimensioned vertical layers. The body is then heated to a suitable temperature to cause the dopant to diffuse from the narrow dimensioned vertical layers into the silicon body to form the diffusions having narrow dimensions therein contiguous with the source and drain regions and of opposite conductivity to the source and drain regions. Therefore, where the source and drain regions are N type the dopant in the narrow dimensioned vertical layers in P type and the heating of the body produces P type diffusion contiguous to the source and drain regions. The P type diffusion is the effective channel for the double diffused integrated circuit devices. The FET devices are completed by forming the gate electrodes between the source and drain regions and contacts to the source and drain regions. It is seen that the thickness of the deposited layer which can be controlled to a very precise degree is the dimension of the effective channel diffusions.

Bipolar integrated circuit devices can also be made according to the present process wherein a silicon body having dielectrically isolated regions therein of monocrystalline silicon is provided. Within certain of the monocrystalline silicon regions a base region is found which is dielectrically isolated from the collector reach-through region and a buried collector region is connected to the surface of the silicon body by means of the reach-through region. Insulator regions having substantially horizontal surfaces and substantially vertical surfaces are formed on the silicon body wherein certain of the insulator regions partially cover the base and collector reach-through regions in the certain of the monocrystalline silicon regions. A layer having a desired dopant concentration therein is deposited on both the substantially horizontal surfaces and substantially vertical surfaces. The reactive ion or plasma etching process is utilized to substantially remove the layer from the horizontal surfaces and to provide a narrow dimensioned layer on the substantially vertical surfaces. The structure is heated at the desired temperature to cause the dopant to diffuse into the body for simultaneously forming the emitter and collector reach-through regions. The doped polycrystalline silicon which was the source of the dopant to form the emitter and collector reach-through regions may now be used as the contacts for the emitter and collector reach-through regions, or alternatively, may be removed by etching and metal contacts laid down.

A merged transistor logic structure or an integrated injection logic structure can be formed by the present process by providing a silicon body with N type monocrystalline silicon regions isolated from other N type monocrystalline silicon regions. Two P type regions are formed in certain of the N type monocrystalline regions. Insulator regions having substantially horizontal surfaces and substantially vertical surfaces are formed on the silicon body and over one of the P type regions. A layer having a desired N type dopant concentration therein is formed on both the substantially horizontal surfaces and substantially vertical surfaces. Reactive ion etching is utilized to substantially remove the layer from the horizontal surfaces and to provide a narrow dimensioned layer on the substantially vertical surfaces over one of the P type regions. The body is heated at a suitable temperature to cause the dopant to diffuse into the body to form the N type diffusions having narrow dimensions in the one P type region. Electrical contacts are laid down to the P regions and N regions so as to form the integrated injection logic integrated circuit.

DISCLOSURE OF THE INVENTION

Figure 1A:
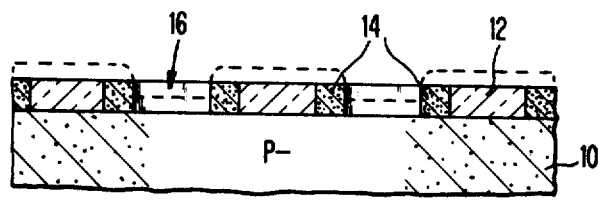
FIGS. 1A through 1D show a first embodiment involving the formation of diffusions having narrow dimensions into a silicon body.
Figure 1B:
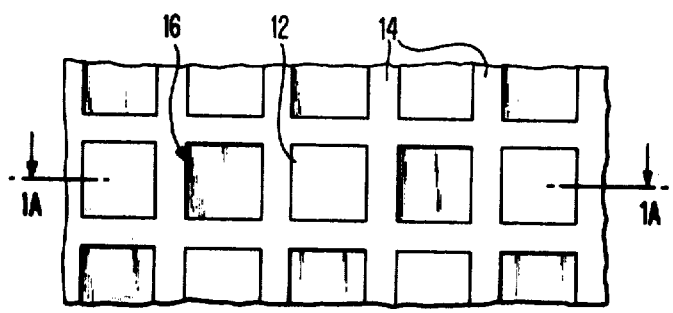
Figure 1C:
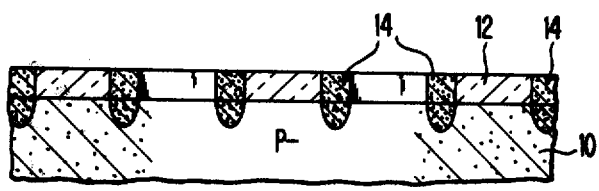
Figure 1D:
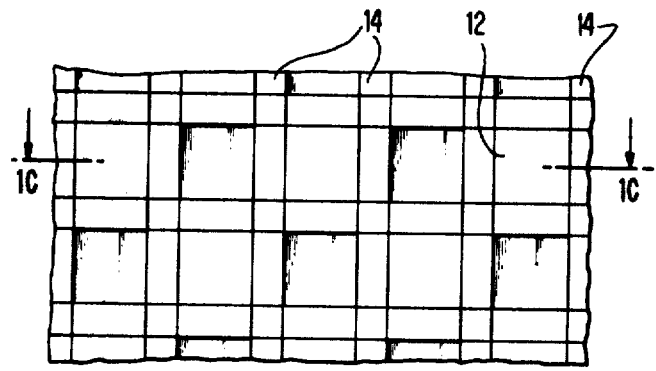

Referring now more particularly to FIGS. 1A through 1D, the basic manufacturing steps for one form of the invention is described. FIG. 1A illustrates one small, greatly enlarged portion of a silicon body which will be used to form a very dense integrated circuit. A monocyrstalline silicon body 10 is provided. An insulating layer 12 is formed upon one major surface of the P− monocrystalline silicon region substrate 10. The silicon substrate 10 may, of course, be of any desired conductivity, whether P or N. The layer 12 may be composed of a variety of materials or combinations of materials which include silicon dioxide, silicon nitride, aluminum oxide, and the like. This first insulating layer 12 is now partially removed, as indicated in FIG. 1A, by an etching technique which is preferably the reactive ion etching process which is described in more detail in the references cited in the Background Art section above. The reactive ion etching ambient is different depending upon the different insulator layer being etched, as described in the above-referred to "A Survey of Plasma-Etching Processes" by Richard L. Bersin. A second layer 14 is deposited over the surface. The second layer is composed of a material which may be an insulator, polycrystalline silicon, or the like, and highly doped with a P+ dopant such as boron in this example. It is deposited upon the substantially horizontal surfaces and substantially vertical surfaces which are the result of the etching process of the first insulating layer 12. The FIG. 1A structure is placed in a reactive ion etching ambient which is tailored to remove the second layer 14. Reactive ion etching proceeds to remove the second layer 14 from the substantially horizontal surfaces as shown by the dashed lines, and have substantially no effect on the substantially vertical surfaces. The result of the reactive ion etching is a narrow dimensioned second layer 14 present on the vertical surfaces. Openings are indicated by layer 16. FIG. 1B shows the plan view of the FIG. 1A structure with the FIG. 1A section indicated at 1A:1A thereon. The next step is to diffuse the P+ dopant by the thermal diffusion method from the vertical narrow dimensioned layer 14 onto the P substrate 10. The layers 12 and 14 are removed preferably for further device processing. The result of the diffusion is shown in FIG. 1C which may act as, for example, a channel stopper for MOS field effect transistor devices. The diffusion pattern can also be used for junction isolation purposes between bipolar devices which would be subsequently formed within the pattern as known in the art. A sectional top view of FIG. 1C along lines 1D:1D is shown in FIG. 1D. The view shows a checkerboard square isolation grid. Other patterns of isolation are, of course, possible.

Figure 2A:
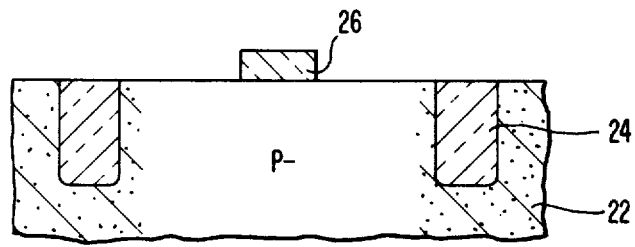
FIGS. 2A through 2E show a second embodiment for forming diffusions into a silicon body in the manufacture of a double diffused field effect integrated circuit device.

Referring now to FIGS. 2A through 2E, there is shown a method for forming a double diffused field effect transistor device with a flat doping profile and a short channel. FIG. 2A illustrates one small, greatly enlarged portion of a monocrystalline silicon body which will be used to form a very dense double diffused MOS field effect integrated circuit. A P− substrate of monocrystalline silicon 22 having a <100> crystallographic orientation and a resistance of the order of 1 to 20 ohms-cm is provided. Isolation means 24 is provided for isolating regions of the monocrystalline silicon substrate 22 from other regions of the monocrystalline silicon substrate. The isolation may be, for example, partial dielectric isolation or complete dielectric isolation. The dielectric materials used may be silicon dioxide, silicon nitride, glass, and so forth. The preferred isolation for highly dense integrated circuits is partial dielectric isolation as illustrated in FIG. 2A. There are many ways in the art to form dielectric isolation regions of this type. It is preferred to use the process described in the J. A. Bondur et al. Patent Application Ser. No. 824,361 filed Aug. 15, 1977, now U.S. Pat. No. 4,104,086, and assigned to the assignee of the present patent application. In that patent application, the process for forming partial dielectric isolation for the region 24 is described in detail.

A silicon dioxide layer 26 of the order of 5000 Angstroms in thickness is formed by either the thermal oxidation process or the chemical vapor deposition process. This layer 26 may be thermally grown in an oxygen or oxygen-water vapor ambient at a temperature of about 970° C. A second method for growing silicon dioxide involves the use of chemical vapor deposition process wherein $SiH_4$, $O_2$ at about 450° C.; or $SiH_2Cl_2$, $N_2O$ at a temperature of about 800° C. under atmospheric or low pressure conditions. Alternate insulating layers or combinations thereof may be formed in place of the silicon dioxide.

Standard photolithography and etching techniques are utilized to make openings in the first insulator layer 26. Alternatively, reactive ion etching techniques may be used. The openings in the layer 26 are located where it is desired to have the source and drain of the double diffused MOS field effect devices.

Figure 2B:
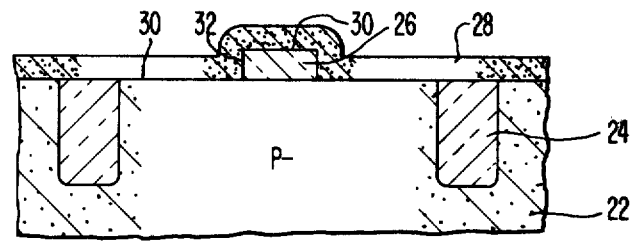
Figure 2C:
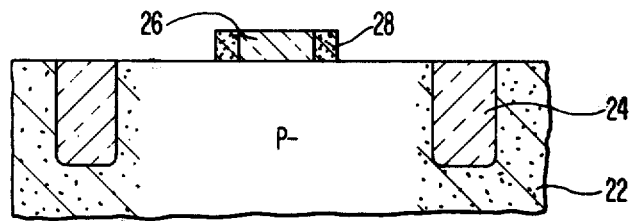

A second layer 28 is formed on both the substantially horizontal surfaces 30 and vertical surfaces 32. This layer 28 in the present example is composed of chemical vapor deposited silicon dioxide according to the method described above or polycrystalline silicon. The layer 28 is heavily doped with P+. The operative thickness of the silicon dioxide is between about 500 to 20,000 Angstroms with 4000 Angstroms preferred. Should the thickness be greater than about 20,000 Angstroms, charge transfer problems and longer etching times occur. If the thickness is less than about 1000 Angstroms, shorting problems occur. The structure of FIG. 2B is placed in a suitable reactive ion etching ambient for the material of layer 28. The reactive ion etching process substantially removes the horizontal portion of layer 28 and provides the narrow dimensioned vertical region shown in FIG. 2C.

Figure 2D:
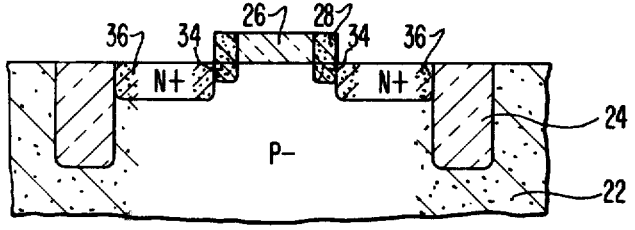

N+ ions are now diffused through the source and drain openings to form regions 36. This step may be accomplished by either the thermal diffusion or ion implantation techniques using phosphorus, arsenic or antimony, or the like, as the N dopant. During the drive-in step for the ion implantation or thermal diffusion, the P+ dopant from layer 28 diffuses into the substrate 22 to form the very narrow P effective channel region 34. The N+ region is preferably deeper than the P region 34. The resulting structure is shown in FIG. 2D. The preferred physical dimensions of the structure has the P region 34 of that FIG. 2D being approximately 5000 Angstroms in width and 2000 Angstroms in depth, the N+ region 36 being approximately 3000 Angstroms in depth.

Figure 2E:
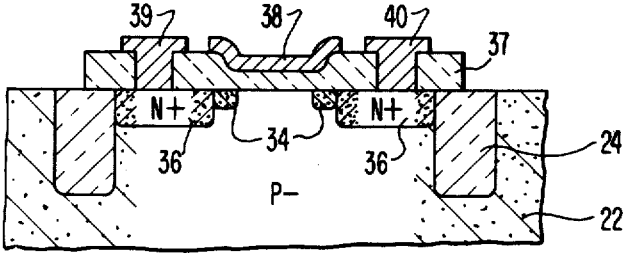

The FET device may now be completed by first removing layers 26, 28. Silicon dioxide layer 37 is grown preferably by a low temperature process such as the chemical vapor deposition process as described above or by thermal oxidation. In a dry $O_2$ ambient at 800° C. or 900° C., heavily doped N+ region of phosphorus doping has been shown to grow substantially thicker thermal oxide than that of lightly doped N region or P region. This process is taught, for example, by C. P. Ho, et al, at "Thermal Oxidation of Heavily Phosphorus-Doped Silicon", published April 1978 in J. Electrochem. Society, Solid State Science and Technology, pp 665–671. This process results in a thicker layer of silicon dioxide over the N+ regions than the P regions, as shown in FIG. 2E. This is a semi-selfalignment technique. The gate electrode 38 and source and drain contact 39 and 40 are formed by a blanket deposition of a suitable conductor, such as aluminum, followed by delineation steps. One alternative is to form gate electrode and source and drain contact by a more conventional process as shown in FIG. 2D in the related patent application, Ser. No. 957,605, filed like date titled, "Method for Forming A Narrow Dimensioned Mask", by I. T. Ho and J. Riseman (FI9-78-023).

Figure 3A:
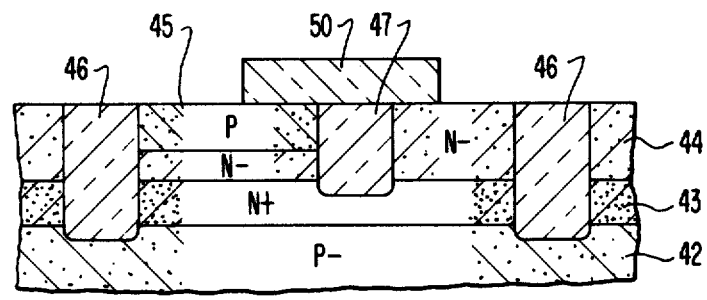
FIGS. 3A through 3F show a third embodiment of a method for forming a bipolar integrated circuit device.
Figure 3B:
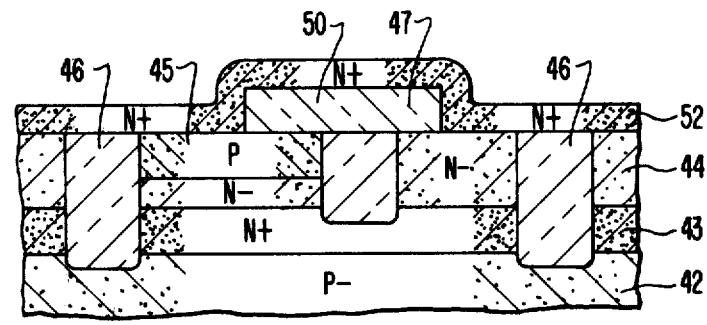

Referring now to the embodiment of FIGS. 3A through 3F for forming a bipolar, submicrometer emitter integrated circuit. FIG. 3A illustrates one small, greatly enlarged portion of a silicon body which will be used to form a very dense bipolar integrated circuit. This illustration uses NPN transistors but obviously PNP transistors can be formed using opposite conductivities. A P− substrate of monocrystalline silicon 42 has a blanket subcollector N+ diffusion 43 named therein. An epitaxial N− layer 44 is then grown on top of the substrate. These processes are stardard processes in the formation, for example, of NPN bipolar transistors. The substrate is typically a <100> crystallographic orientation monocrystalline silicon wafer having a resistance of the order of 1 to 20 ohm-cm. The subcollector diffusion is formed using arsenic having a surface concentration of about $10^{20}/cm^3$, at about 1200° C. for about 100 minutes.

The epitaxial growth process to form the layer 44 may be by conventional techniques, such as the use of $SiCl_4/H_2$ or $SiH_4/H_2$ mixtures at temperatures about 1000° to 1200° C. During the epitaxial growth the dopant in the N+ layer moves into the epitaxial layer. The thickness of the epitaxial layer for highly dense integrated circuits is equal to or less than about 3 micrometers. A mask (not shown), such as thermally grown silicon dioxide, is formed on the surface of the epitaxial layer and by suitable photolithographic and etching techniques has mask openings formed therein in the areas where dielectric isolation between regions of monocrystalline silicon and between regions designated as the base emitter area and the collector reach-through area are to be separated. FIG. 3A shows the partial dielectric isolation with dielectric regions 46 isolating monocrystalline silicon regions of the silicon body from one another and a region 47 which isolates the base emitter region from the collector reach-through region. There are many ways in the art to form dielectric regions of this type. It is preferred to use the beforementioned mask and the reactive ion etching process for silicon described in the J. A. Bondur, et al patent application Ser. No. 824,361, filed Aug. 15, 1977, now U.S. Pat. No. 4,104,086, and assigned to the assignee of the present invention. In that patent application the reactive ion etching to form depressions through the mask openings and thereafter filling of the depressions with silicon dioxide dielectric isolation for the regions 46 and 47 is described in detail.

The surface of the monocrystalline silicon structure is masked using standard silicon dioxide, photolithography and etching techniques to form openings in the silicon dioxide mask where the base region is desired. A P type base region 45 is formed by ion implantation or thermal diffusion techniques with a surface concentration of about $5 \times 10^{19}/cm^3$ at about 925° C. for about 40 minutes.

Figure 3C:
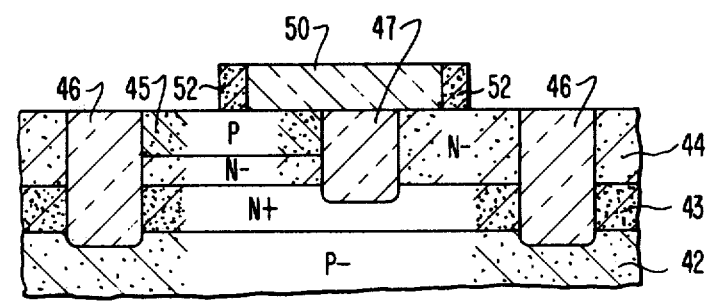
Figure 3D:
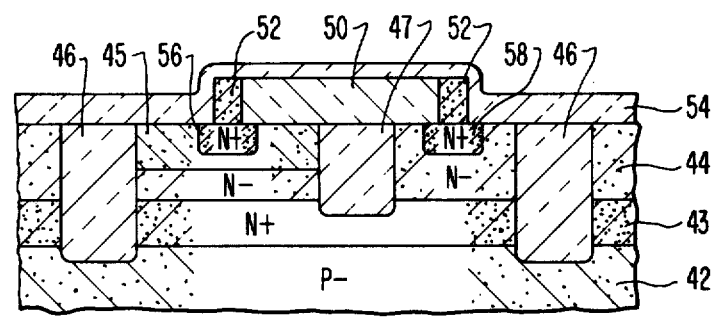
Figure 3E:
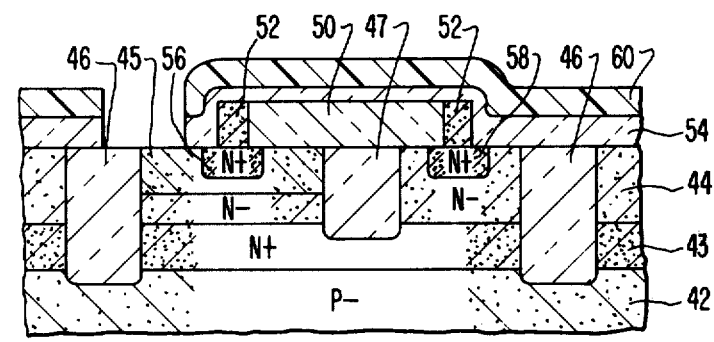
Figure 3F:
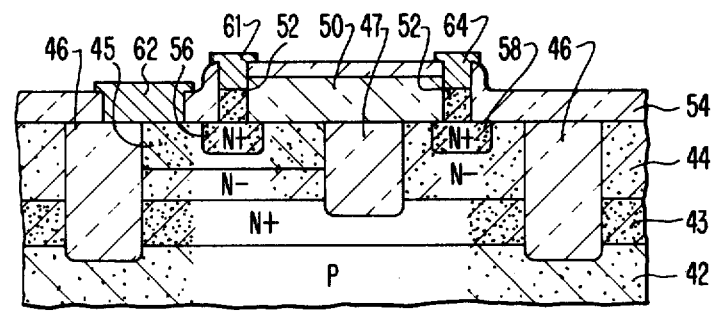

The surface of the structure has then all silicon dioxide removed therefrom. An insulating layer 50 which may be thermally grown silicon dioxide is formed on the silicon body's surface having the dielectric regions 46, 47 extending to its surface. The insulating layer may be any one of other insulator materials mentioned in the other embodiments. Standard lithography and etching techniques are utilized to make a pattern of openings in layer 50 where the emitter and collector reach-through diffusions are to be made. A reactive ion etching technique may also be employed. The etched insulator layer 50 now has substantially horizontal surfaces and substantially vertical surfaces. A second layer 52 composed of an insulator material, polycrystalline silicon, or the like, which is heavily doped with N+ is formed upon the substantially horizontal surfaces and the substantially vertical surfaces. The layer in this particular embodiment is preferred to be polycrystalline silicon. The polycrystalline silicon deposition is by the chemical vapor deposition process by using, for example, a mixture of silane and a conductivity changing impurity, P or N depending on the requirement in a hydrogen ambient in the temperature range of 500° to 1000° C. Alternatively, the polycrystalline silicon can be deposited and then doped by ion implantation. The thickness of the second insulating layer is between about 1000 to 10,000 Angstroms and preferably 4000 Angstroms. The thickness of the layer will tailor the size of the emitter and collector reach-through diffused regions' widths. The FIG. 3B structure is put in a reactive ion etching ambient for polycrystalline silicon. Layer 52 is substantially removed from all horizontal surfaces as shown in FIG. 3C. Silicon dioxide is now thermally grown at 970° C. in oxygen or oxygen-water vapor ambient on the silicon surfaces to form layer 54. The FIG. 3D structure is exposed to a temperature of between about 1000° C. to 1100° C. for about 100 to 300 minutes to drive in the N+ impurities from the vertical layers 52 into the P base 45 to form emitter 56 and into N− region to form collector reach-through contact 58.

A block-out mask 60 composed of a suitable photoresist is deposited, exposed and developed as is known in the art to form an opening in silicon dioxide layer 54 to the base region 45. The layer 60 is removed. The silicon dioxide 54 is etched down to polycrystalline silicon layer 52 and the layer 52 partially removed or completely removed to the monocrystalline silicon regions 56 and 58. Suitable conductor contacts 61, 62, and 64 can now be made to the emitter, base and collector, respectively, by blanket depositing and etching steps to provide the desired pattern of conductors. Alternatively, the base contact hole and the contact holes for the emitter and the collector could be opened with a single mask if so desired.

Figure 4A:
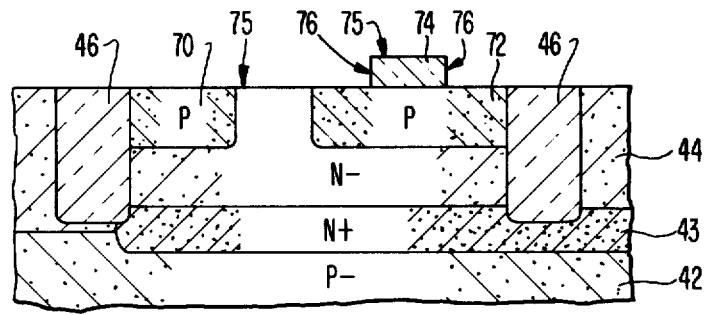
FIGS. 4A through 4D show a fourth embodiment of the present invention wherein an integrated injection logic type bipolar device is formed using the method to make narrow dimensioned diffusions into a silicon body.
Figure 4B:
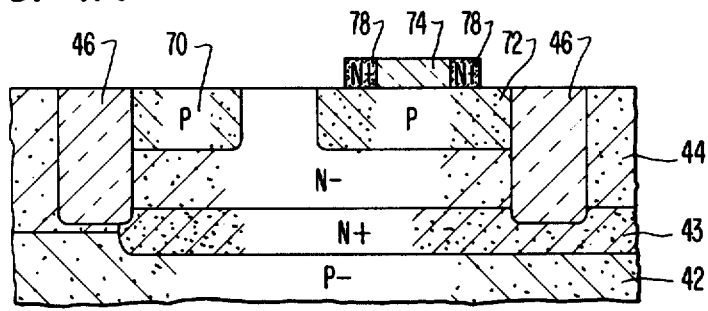
Figure 4C:
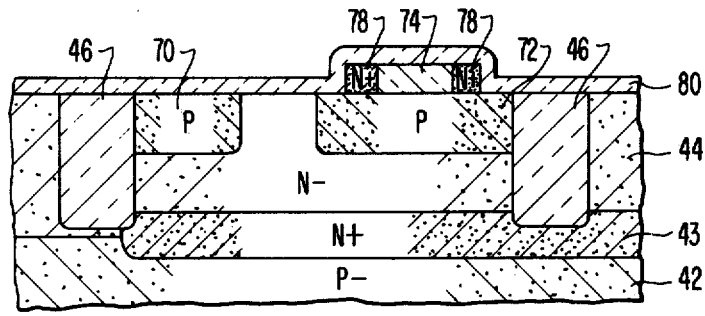
Figure 4D:
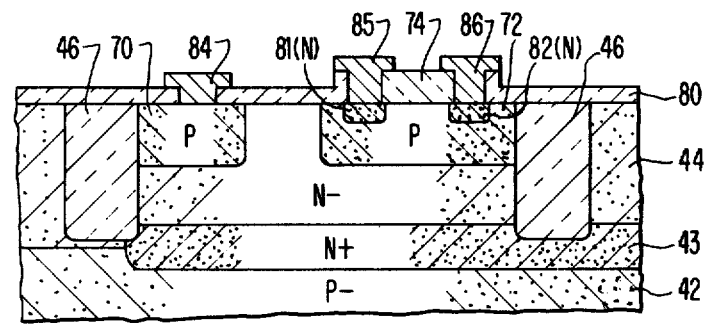

Referring now to the embodiment of FIGS. 4A through 4D for forming integrated injection logic bipolar integrated circuit. FIG. 4A shows one small, greatly enlarged portion of a silicon body which will be used to form the integrated injection logic device. The FIG. 4A structure is formed in a similar manner to that of the FIG. 3A structure and like numbers indicate like structures. Instead of a P base region in certain of the dielectric isolated monocrystalline silicon regions, two P type regions 70 and 72 are formed therein. An insulating layer 74 is formed over the body by thermal oxidation or by chemical deposition techniques. The layer can be one or a combination of insulating materials mentioned in the other embodiments. Standard lithography and etching techniques, including reactive ion etching, are utilized to make a pattern of openings in layer 74. The layer 74 remains over a portion of one of the P regions as shown in FIG. 4A. The layer and silicon body have horizontal surfaces 75 and vertical surfaces 76. A second layer 78 composed of an insulator material, polycrystalline silicon, or the like, which is heavily doped with N+ is formed upon the substantially horizontal surfaces and the substantially vertical surfaces. The layer in this particular embodiment is preferred to be polycrystalline silicon. The polycrystalline silicon deposition is by the chemical vapor deposition process described above in the FIGS. 3A–3F embodiment. The thickness of the second insulating layer is the same of the FIGS. 3A–3F embodiment. The thickness of the layer will tailor the size of the N type openings desired. The structure is put in a reactive ion etching ambient for polycrystalline silicon. Layer 74 is substantially removed from all horizontal surfaces and leaving the region 74 on the vertical surfaces as shown in FIG. 4B. Silicon dioxide is now thermally grown by chemical vapor deposition as described above on the silicon surfaces to form layer 80. The FIG. 4C structure is heated to 1000° to 1100° C. for about 100 to 300 minutes to drive in the N+ dopant from layer 78 into the P region 72 to form N regions 81 and 82. The contacts to the integrated injection logic integrated circuit are made according to the block-out mask and etching of polycrystalline silicon techniques followed by metal deposition as described in relation to the FIGS. 3A–3F embodiment. Electrode 84 contacts region 70, electrode 85 contacts region 81, electrode 86 contacts region 82. Regions 44 and 72 are also contacted by electrodes to form the integrated injection device, but the electrodes are not specifically shown in FIG. 4D. Further information about this type of integrated circuit can be obtained from the H. H. Berger et al U.S. Pat. No. 3,736,477.

While the invention has been particularly shown and described with reference to the preferred embodiments thereof, it will be understood by those skilled in the art that various changes in form and detail may be made therein without departing from the spirit and scope of the invention.

Having thus described my invention, what I claim as new, and desire to secure by Letters Patent is:

1. A method for forming diffusions having narrow dimensions in a silicon body comprising:
   providing a silicon body;
   forming on said body insulator regions having substantially horizontal surfaces and substantially vertical surfaces;
   forming a layer having a desired dopant concentration therein on both said substantially horizontal surfaces and said substantially vertical surfaces;
   reactive ion etching said layer to substantially remove the said layer from said horizontal surfaces and to provide a narrow dimensioned layer on the said substantially vertical surfaces; and
   heating said body at suitable temperature to cause said dopant to diffuse into said body to form said diffusions having narrow dimensions therein.

2. The method of claim 1 wherein portions of said narrow dimensioned layer are removed prior to said heating to provide at least two distinct layers and after said heating at least two distinct diffusions having the narrow dimension.

3. The method of claim 1 wherein a pattern of said diffusions enclose regions of monocrystalline silicon and field effect transistor devices are formed within certain of these regions.

4. The method of claim 1 wherein a pattern of said diffusions enclose regions of monocrystalline silicon and bipolar devices are formed within certain of these regions.

5. The method of claim 1 wherein said insulator regions are on a major surface of said body and in a pattern wherein the corners of adjacent like regions touch.

6. The method of claim 5 wherein the said insulator regions are composed of silicon dioxide and said narrow dimensioned layer being composed of highly doped polycrystalline silicon.

7. The method of claim 6 further comprising removing said insulator regions and narrow dimensioned layer.

8. A method for forming a double diffused field effect integrated circuit device in a silicon body comprising:
   providing a silicon body;
   forming on said body insulator regions having substantially horizontal surfaces and substantially vertical surfaces;
   forming a layer having a desired dopant concentration therein on both said substantially horizontal surfaces and said substantially vertical surfaces;
   reactive ion etching said layer to substantially remove said layer from said horizontal surfaces, to provide a narrow dimensioned layers on the said substantially vertical surfaces and form openings to said silicon body;
   forming the source and drain regions through said openings which are adjacent to said narrow dimensioned layers;
   heating said body at suitable temperature to cause said dopant to diffuse into said body to form said diffusions having narrow dimensions therein contiguous with said source and drain regions and of opposite conductivity type thereto; and
   forming the gate electrodes being said source and drain regions and contacts to said source and drain region to establish said double diffused field effect integrated circuit.

9. The method of claim 8 wherein said diffusions having narrow dimensions are each between a pair of source and drain N+ regions and are P type.

10. The method of claim 8 wherein said diffusions having narrow dimensions are each between a pair of source and drain P+ regions and are N type.

11. The method of claim 8 wherein the said insulator regions are composed of silicon dioxide and said narrow dimensioned layer being composed of highly doped polycrystalline silicon.

12. The method of claim 8 wherein the source and drain regions are N+, the said diffusions having narrow dimensions are N type and the silicon body being P type; and further comprising removing said insulator regions and said polycrystalline silicon regions after heating said body and thermally growing a silicon dioxide layer on the surface having said source and drain regions and said diffusions so that the said silicon dioxide layer is thicker on said N+ source and drain regions and thin on said P regions; and forming the gate electrode over said P regions.

13. A method for forming a bipolar integrated circuit device in a silicon body comprising:
   providing a silicon body having dielectrically isolated regions therein of monocrystalline silicon;
   providing in certain of said monocrystalline regions a base region dielectrically isolated from a collector reach-through region and a buried collector region connected to the surface of said body by means of said reach-through;
   forming on said body insulator regions having substantially horizontal surfaces and substantially vertical surfaces wherein certain of said insulator regions partially cover the base and collector reach-through regions in said certain of said monocrystalline regions;
   forming a layer having a desired dopant concentration therein on both said substantially horizontal surfaces and said substantially vertical surfaces;
   reactive ion etching said layer to substantially remove said layer from said horizontal surfaces and to provide a narrow dimensioned layer on the said substantially vertical surfaces; and
   heating said body at suitable temperature to cause said dopant to diffuse into said body to simultaneously form emitter and collector reach-through regions.

14. The method of claim 13 wherein said heating is accomplished in an oxidizing atmosphere and a silicon dioxide coating results from said heating on all uncovered silicon surfaces.

15. The method of claim 14 further comprising forming openings to said emitter, base and collector reach-through regions and forming electrical contacts thereto.

16. A method for forming an integrated injection logic integrated circuit device in a silicon body comprising:
   providing a silicon body with N type monocrystalline silicon regions isolated from other N type monocrystalline silicon regions;
   forming two P type regions in certain of said N type monocrystalline regions;
   forming on said body and over one of said P type regions, insulator regions having substantially horizontal surfaces and substantially vertical surfaces;
   forming a layer having a desired N type dopant concentration therein on both said substantially horizontal surfaces and said substantially vertical surfaces;
   reactive ion etching said layer to substantially remove said layer from said horizontal surfaces and to provide a narrow dimensioned layer on the said substantially vertical surfaces over said one of said P type regions;
   heating said body at suitable temperature to cause said dopant to diffuse into said body to form N type diffusions having narrow dimensions in said one of said P type regions; and
   making electrical contacts to the said P regions and N regions so as to form said integrated injection logic integrated circuit.

17. The method of claim 16 wherein said layer having a desired dopant is a polycrystalline silicon layer and said making electrical contact includes removing said polycrystalline silicon narrow dimensioned layer.

18. The method of claim 16 wherein said monocrystalline silicon regions isolated from one another are isolated by dielectric silicon dioxide.

* * * * *